(12) United States Patent
McBride

(10) Patent No.: US 6,507,807 B1
(45) Date of Patent: Jan. 14, 2003

(54) METHOD AND APPARATUS FOR DETERMINING WHICH BRANCH OF A NETWORK OF AN INTEGRATED CIRCUIT HAS THE LARGEST TOTAL EFFECTIVE RC DELAY

(75) Inventor: John G McBride, Ft Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/373,682

(22) Filed: Aug. 13, 1999

(51) Int. Cl.[7] .................................................. G06F 9/44
(52) U.S. Cl. ............................. 703/14; 703/17; 716/4; 716/6; 716/5
(58) Field of Search ........................ 703/14, 17; 716/6, 716/16, 18, 4, 8, 5

(56) References Cited

U.S. PATENT DOCUMENTS

| | | | | |
|---|---|---|---|---|
| 4,924,430 A | * | 5/1990 | Zasio et al. .................. | 364/578 |
| 5,461,576 A | * | 10/1995 | Tsay et al. ................... | 364/490 |
| 5,572,437 A | * | 11/1996 | Rostoker et al. ............. | 364/489 |
| 5,831,867 A | * | 11/1998 | Aji et al. ...................... | 364/489 |
| 5,910,897 A | * | 6/1999 | Dangelo et al. ............. | 364/488 |
| 6,189,131 B1 | * | 2/2001 | Graef et al. .................... | 716/8 |
| 6,286,126 B1 | * | 9/2001 | Raghavan et al. .............. | 716/6 |
| 6,367,055 B1 | * | 4/2002 | McBride ........................ | 716/4 |

* cited by examiner

Primary Examiner—Kevin J. Teska
Assistant Examiner—T. Pham

(57) ABSTRACT

The present invention provides a method and apparatus for determining the RC delays associated with branches of a network comprised in an integrated circuit. The apparatus comprises logic configured to execute a rules checker algorithm. When the rules checker algorithm is executed, the algorithm analyzes information relating to the network and determines the total effective RC delays between the output of a driver gate of the network and the inputs of one or more receiver gates of the network. In accordance with the preferred embodiment of the present invention, the rules checker algorithm performs these tasks by: (1) analyzing each branch of the network to determine the primary RC delay of each branch assuming the branch being analyzed corresponds to the worst case RC delay of the network; (2) analyzing each branch of the network assuming one of the other branches of the network corresponds to the worst case RC delay of the network and determining the effect that the resistances and capacitances of the branch being analyzed would have on other branches; (3) determining the total effective RC delay of each branch by combining the primary RC delay of each branch with the effect that the other branches have on the branch being analyzed; and (4) determining which branch of the network has the largest total effective RC delay.

20 Claims, 10 Drawing Sheets

FROM FIG. 6B

221

```
MAX_RC=0
FOR i=0 TO NUM_BRANCHES-1
      CURRENT_RC = RETURNED_RC[i]
      FOR j=0 TO NUM_BRANCHES-1
          IF i≠j
              CURRENT_RC+=EFF_RC[j]
      NEXT j
          IF CURRENT_RC > MAX_RC
          MAX_RC = CURRENT_RC
NEXT i
CLEAR_MARK(STARTING NODE)
RETURN (MAX_RC+CUMMULATIVE_r x
CAP(STARTING NODE)
```

FIG. 6D

METHOD AND APPARATUS FOR DETERMINING WHICH BRANCH OF A NETWORK OF AN INTEGRATED CIRCUIT HAS THE LARGEST TOTAL EFFECTIVE RC DELAY

TECHNICAL FIELD OF THE INVENTION

The present invention generally relates to computer-aided circuit design systems and, more particularly, to a method and apparatus for determining which branch of a network of nodes of an integrated circuit has the largest total effective RC delay.

BACKGROUND OF THE INVENTION

Integrated circuits are electrical circuits comprised of transistors, resistors, capacitors, and other components comprised on a single semiconductor "chip" in which the components are interconnected to perform a given function. Typical examples of integrated circuits include, for example, microprocessors, programmable logic devices (PLDs), electrically erasable programmable memory devices (EEPROMs), random access memory devices (RAMs), operational amplifiers and voltage regulators. A circuit designer typically designs the integrated circuit by using very large scale integrated (VLSI) circuit design techniques to create a circuit schematic which indicates the electrical components and their interconnections. Often, designs are simulated by computer to verify functionality and to ensure that performance goals are satisfied.

In the world of electrical device engineering, the design and analysis work involved in producing electronic devices is often performed using electronic computer aided design (E-CAD) tools. As will be appreciated by those skilled in the art, electronic devices include electrical analog, digital, mixed hardware, optical, electro-mechanical, and a variety of other electrical devices. The design and the subsequent simulation of any circuit board, VLSI chip, or other electrical device via E-CAD tools allows a product to be thoroughly tested and often eliminates the need for building a prototype. Thus, today's sophisticated E-CAD tools may enable the circuit manufacturer to go directly to the manufacturing stage without having to perform costly, time consuming prototyping.

In order to perform the simulation and analysis of a hardware device, E-CAD tools must deal with an electronic representation of the hardware device. A "netlist" is one common representation of a hardware device. As will be appreciated by those skilled in the art of hardware device design, a "netlist" is a detailed circuit specification used by logic synthesizers, circuit simulators and other circuit design optimization tools. A netlist typically comprises a list of circuit components and the interconnections between those components.

The two forms of a netlist are the flat netlist and the hierarchical netlist. Often, a netlist will contain a number of circuit "modules" which are used repetitively throughout the larger circuit. A flat netlist will contain multiple copies of the circuit modules essentially containing no boundary differentiation between the circuit modules and other components in the device. By way of analogy, one graphical representation of a flat netlist is simply the complete schematic of the circuit device.

In contrast, a hierarchical netlist will only maintain one copy of a circuit module which may be used in multiple locations. By way of analogy, one graphical representation of a hierarchical netlist would show the basic and/or non-repetitive devices in schematic form and the more complex and/or repetitive circuit modules would be represented by "black boxes." As will be appreciated by those skilled in the art, a black box is a system or component whose inputs, outputs, and general function are known, but whose contents are not shown. These "black box" representations, hereinafter called "modules", will mask the complexities therein, typically showing only input/output ports.

An integrated circuit design can be represented at different levels of abstraction, such as the Register-Transfer level (RTL) and the logic level, using a hardware description language (HDL). VHDL and Verilog are examples of HDL languages. At any abstraction level, an integrated circuit design is specified using behavioral or structural descriptions, or a mix of both. At the logical level, the behavioral description is specified using boolean equations. The structural description is represented as a netlist of primitive cells. Examples of primitive cells are full-adders, NAND gates, latches, and D-Flip Flops.

Having set forth some very basic information regarding the representation of integrated circuits and other circuit schematics through netlists, systems are presently known that use the information provided in netlists to evaluate circuit timing and other related parameters. More specifically, systems are known that perform a timing analysis of circuits using netlist files. Although the operational specifics may vary from system to system, generally such systems identify certain critical timing paths, and then evaluate the circuit to determine whether timing violations may occur through the critical paths. As is known, timing specifications may be provided to such systems by way of a configuration file.

One such system known in the prior art is marketed under the name PathMill, by EPIC Design Technology, Inc., subsequently purchased by Synopsis, Inc. PathMill is a transistor-based analysis tool used to find critical paths and to verify timing in semiconductor designs. Using static and mixed-level timing analysis, PathMill processes transistors, gates, and timing models. It also calculates timing delays, performs path searches, and checks timing requirements. As is known, PathMill can analyze combinational designs containing gates, and sequential designs containing gates, latches, flip-flops, and clocks. Combinational designs are generally measured through the longest and shortest paths.

While tools such as these are useful for the design verification process after layout, there are various shortcomings in the PathMill product and other similar products. One primary shortcoming of the PathMill program is that it does not analyze the circuits to determine the design quality of the circuits. Rather, the PathMill program performs a static timing analysis of a circuit using the netlist provided to the PathMill program. Furthermore, configuring the PathMill program to recognize various circuit characteristics is typically a very difficult task.

Accordingly, a need exists for a rules checking system that will allow circuits to be evaluated for design quality. The present invention works in conjunction with a tool, such as, for example, the PathMill program, to evaluate the design quality of network nodes of an integrated circuit. Typically, such tools, including the PathMill program, receive a netlist and use the netlist to determine FET (field effect transistor) direction, node types, latches, dynamic gates, rise and fall times, etc. This information is utilized by the rules checking system of the present invention to evaluate the design quality of networks of an integrated circuit.

In accordance with the present invention, the rules checking system evaluates the design quality of networks of an integrated circuit to determine which branch of a network corresponds to the largest total effective RC delay. This total effective RC delay may then be used to make other determinations, such as, for example, to determine the skew of the processor clock that controls the timing of the integrated circuit.

SUMMARY OF THE INVENTION

The present invention provides a method and apparatus for determining the RC delays associated with branches of a network comprised in an integrated circuit. The apparatus comprises logic configured to execute a rules checker algorithm. When the rules checker algorithm is executed, the algorithm analyzes information relating to the network and determines the RC delays between the output of a driver gate of the network and the inputs of one or more receiver gates of the network.

In accordance with the preferred embodiment of the present invention, the rules checker algorithm performs these tasks by: (1) analyzing each branch of the network to determine the primary RC delay of each branch assuming the branch being analyzed corresponds to the worst case RC delay of the network; (2) analyzing each branch of the network assuming one of the other branches of the network corresponds to the worst case RC delay of the network and determining the effect that the resistors and capacitors of the branch being analyzed would have on other branches; (3) determining the total effective RC delay of each branch by combining the effect that the other branches have on the branch being analyzed with the primary RC delay of the branch being analyzed; and (4) determining which branch of the network has the largest total effective RC delay.

These and other features and advantages of the present invention will become apparent from the following description, drawings and claims.

BRIEF DESCRIPTION OF THE DRAWINGS

FIGS. 6A–6D illustrate the functions performed by the electrical rules checker of the present invention shown in FIG. 2 in accordance with the preferred embodiment to determine which branch of the network has the largest total RC delay.

DETAILED DESCRIPTION OF THE INVENTION

Figure 1:
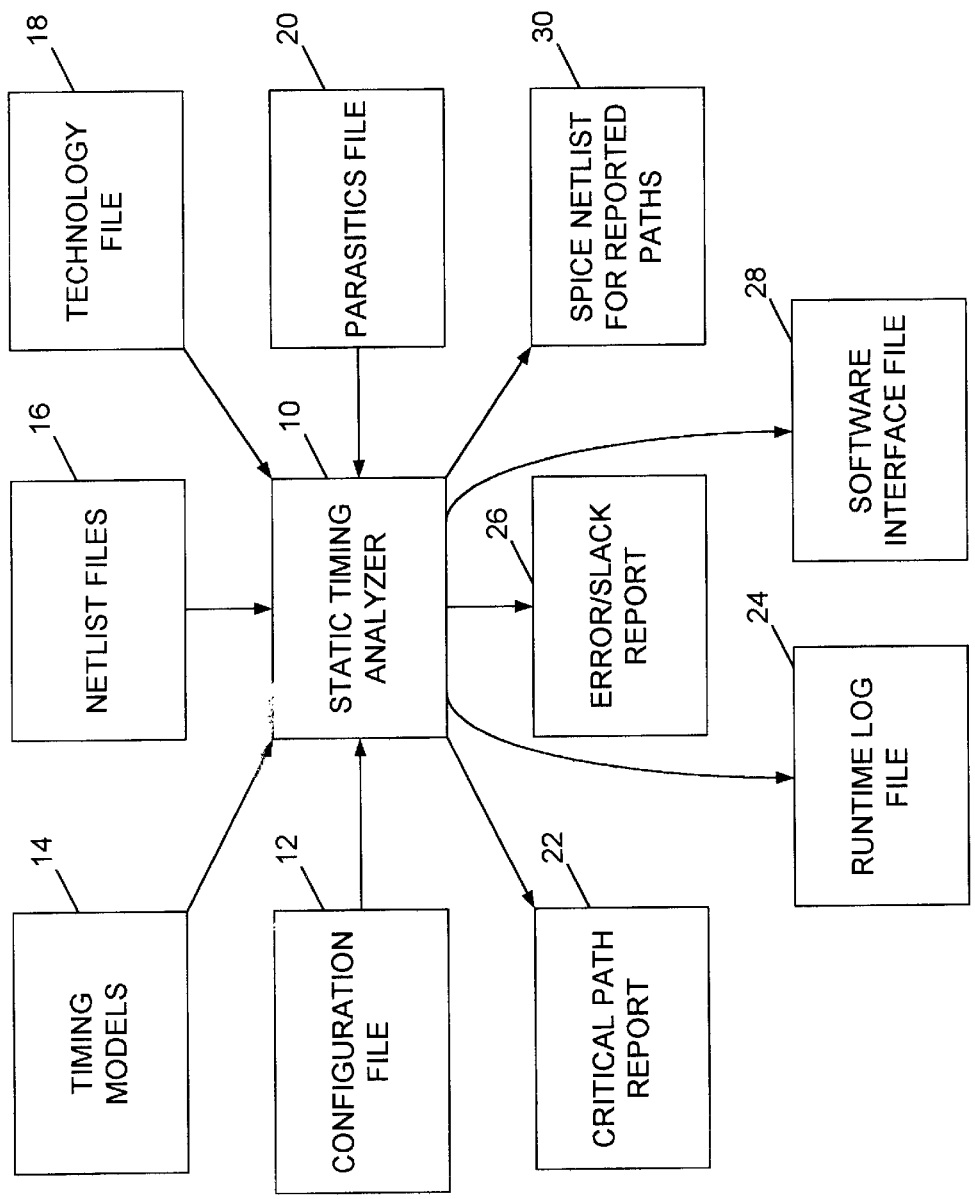
FIG. 1 is a block diagram of a static timing analyzer system, which is known in the art.

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

Referring now to the drawings, reference is made to FIG. 1, which is a block diagram of a prior art static timing analyzer program that illustrates the basic informational flow in such a system. Specifically, and as previously mentioned, one such system is marketed under the name PathMill. FIG. 1 is a diagram that illustrates the informational flow in the PathMill system. At the center of the diagram is a block denoted as static timing analyzer 10, which represents the PathMill program. Surrounding this block 10 are a number of other blocks that represent various input and output files and/or information.

More particularly, the PathMill program may utilize a configuration file 12, a file of timing models 14, one or more netlist files 16, a technology file 18, and a parasitic file 20, for various input information. In addition, the PathMill program may generate a number of different output files or other output information, including a critical path report 22, a runtime log file 24, an error report 26, a software interface file 28, and a SPICE netlist 30. When started, the PathMill program first processes the input netlist file(s) 16, the technology file 18, and the configuration files 12. The information from these files is subsequently used for performing path analyses. Since the PathMill program is publicly available and marketed, its function and operation are well known, and therefore need not be discussed in detail herein.

For purposes of illustrating the present invention, much of the diagram and information illustrated in FIG. 1 is not shown in connection with the inventive system. In this regard, reference is made to FIG. 2, which shows one embodiment of a system constructed in accordance with the present invention. In the illustrated embodiment, only the static timing analyzer 10, the configuration file 12 and the netlist file 16 of FIG. 1 are shown. The configuration file(s) 12 contains information that informs the static timing analyzer 10 how to perform its analysis, and various numbers of configuration files may be used. The netlist file 16, as is known, defines the various integrated circuit components, and their inter-relations.

Figure 2:
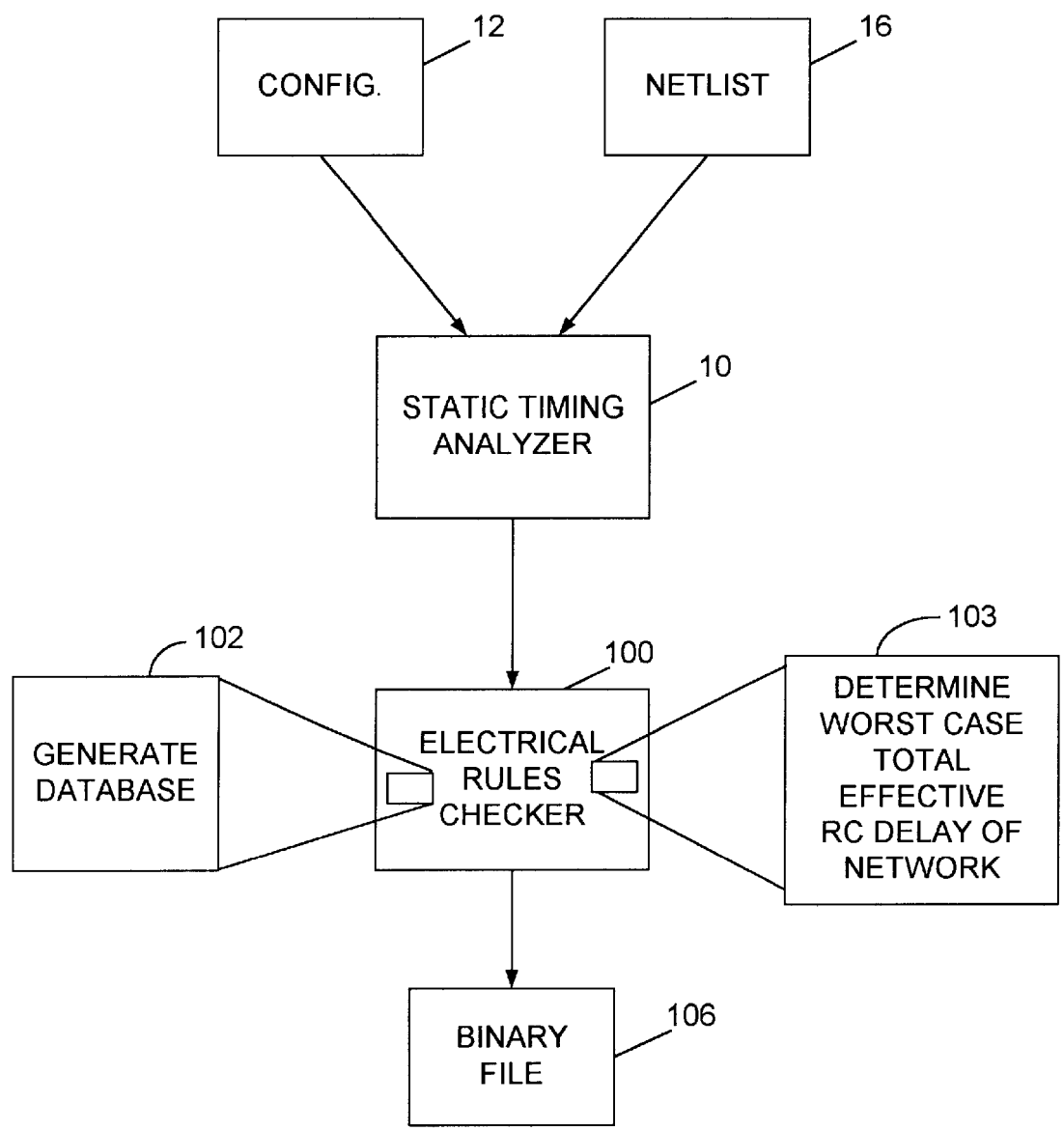
FIG. 2 is a block diagram illustrating the orientation of the electrical rules checker of the present invention in relation to an existing static timing analyzer.

The system shown in FIG. 2 preferably utilizes a computer (not shown) for its operation which runs the static timing analyzer program 10 and the electrical rules checker program 100. The computer may be electrically coupled to a memory device (not shown) which functions as a system storage unit for storing the code and data utilized and/or generated by the system. Those skilled in the art will realize that the present invention is not limited to any particular type of computer or memory device for performing these functions.

It should also be noted that the term "computer", as that term is used herein, is intended to denote any machine capable of performing the calculations, or computations, necessary to perform the tasks of the present invention. In essence, this includes any machine that is capable of accepting a structured input and of processing the input in accordance with prescribed rules to produce an output. Furthermore, those skilled in the art will understand that the system shown in FIG. 2 may be implemented in hardware, software, or a combination of both, and is not limited to any particular physical, structural, or electrical configuration.

The electrical rules checker 100 program of the present invention is preferably configured to operate on an output of the static timing analyzer 10. In this regard, the static timing analyzer may be configured to generate an output netlist database, which the electrical rules checker 100 of the present invention utilizes as an input. As previously mentioned, there are a wide variety of reasons why an electrical rules checking program may be desired. One such reason is to perform various checks over certain rules or strategies in an integrated circuit design. Such rules may vary from circuit to circuit, depending upon the particular application. For example, a portion of the electrical rules checker program 100 may operate to identify predischarge nodes in an integrated circuit design. This is only one example of the multitude of checks that may be performed by the electrical rules checker program 100 of the present invention.

As is known, a large scale integrated circuit design is often generated at the FET level. A designer may utilize thousands of interconnected FETs in designing a portion of an integrated circuit. Although the designer may make every effort to follow certain design guidelines, mistakes may nevertheless be made. Accordingly, the electrical rules checker 100 of the present invention provides an excellent mechanism for double-checking designs and design layouts. Furthermore, the electrical rules checker 100 of the present invention may generate an output binary file 106, which may ultimately be used in subsequent executions of the electrical rules checker 100.

However, prior to the electrical rules checker 100 of the present invention performing any of the rules checking tasks, a database of nodes and elements of the circuit to be evaluated preferably is generated. This database preferably is then utilized by the electrical rules checker 100 of the present invention to perform the rules checking tasks. The manner in which this database is generated will now be discussed below with respect to FIGS. 3A–3C.

For purposes of illustration, it will be assumed that the static timing analyzer 10, shown in FIG. 2 and discussed above, is the Pathmill static timing analyzer, in order to provide an example of one possible implementation of the present invention. However, those skilled in the art will understand that the electrical rules checker 100 of the present invention and the database of the present invention are not limited to use with any particular program.

The Pathmill static timing analyzer provides an application program interface (API) which allows the Pathmill static timing analyzer to communicate with the electrical rules checker 100 of the present invention. This API allows code external to the Pathmill program to be linked to the Pathmill program so that the external code and the Pathmill program itself comprise one executable which can be run as a single program. The electrical rules checker 100 of the present invention utilizes this API to obtain information from the Pathmill static timing analyzer which can be utilized by the electrical rules checker 100 to generate the database of the present invention, as indicated by block 102. This database is then utilized by the rules checker program 100 to perform the task 103 of determining the RC delays of networks in the integrated circuit.

Prior to the database of the present invention being generated, the Pathmill program runs and identifies circuit characteristics of the circuit under consideration such as, for example, FET direction, node types, latches, dynamic gates, clocks, rise and fall times, etc. Before the Pathmill program terminates, it calls the electrical rules checker 100 of the present invention. The Pathmill program has a feature commonly referred to as "hooks", which allows the Pathmill program to call routines at various stages of execution. Once the Pathmill program has finished identifying the characteristics mentioned above, the Pathmill program calls the electrical rules checker 100 of the present invention. The electrical rules checker 100 of the present invention, through this series of subroutine calls, creates its own database of the circuit under consideration.

Figure 3A:
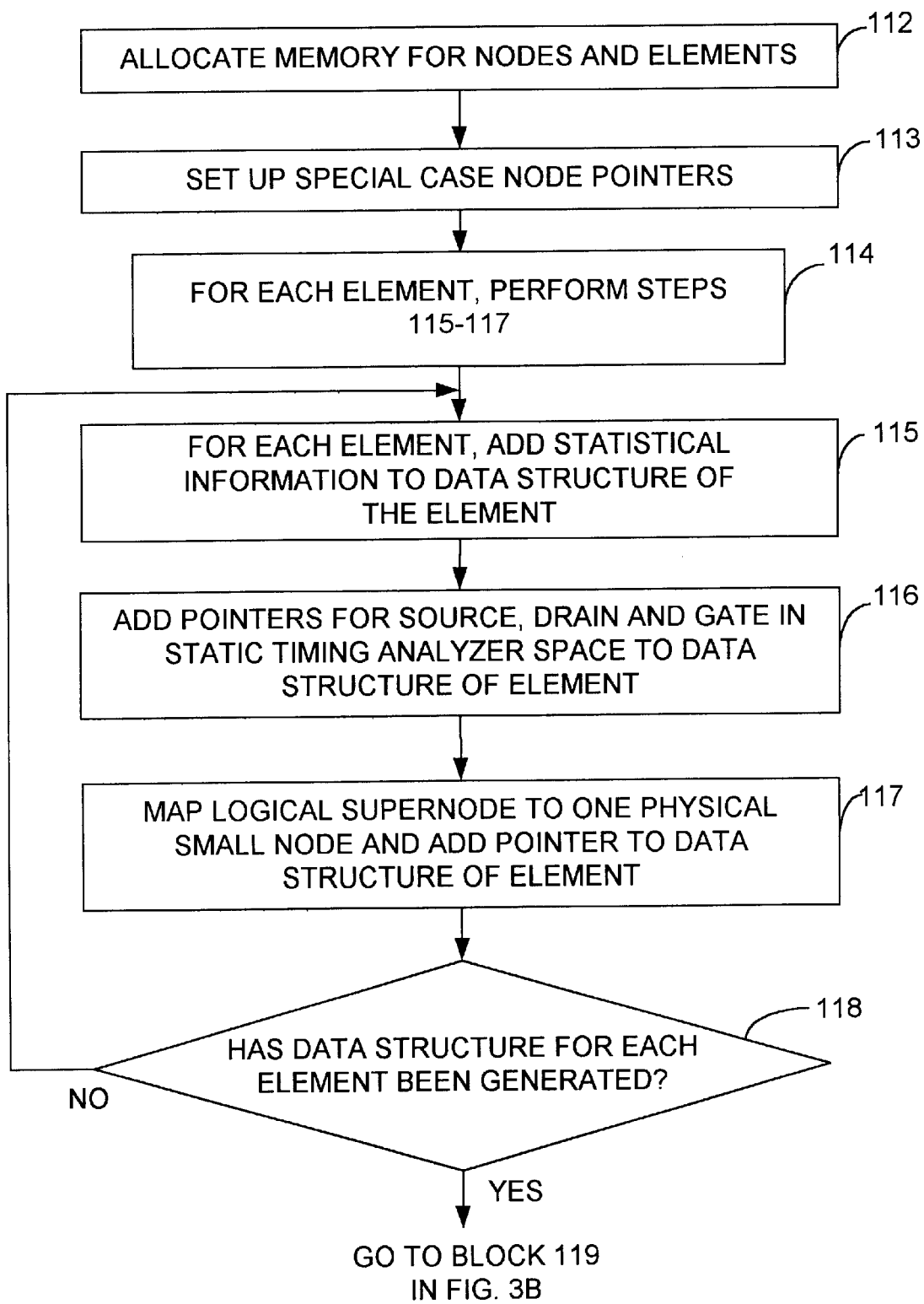
FIGS. 3A–3C together form a flow chart which illustrates the method of the present invention for generating the database of the present invention which can be utilized by the electrical rules checker of the present invention shown in FIG. 2 to perform rules checking tasks.
Figure 3B:
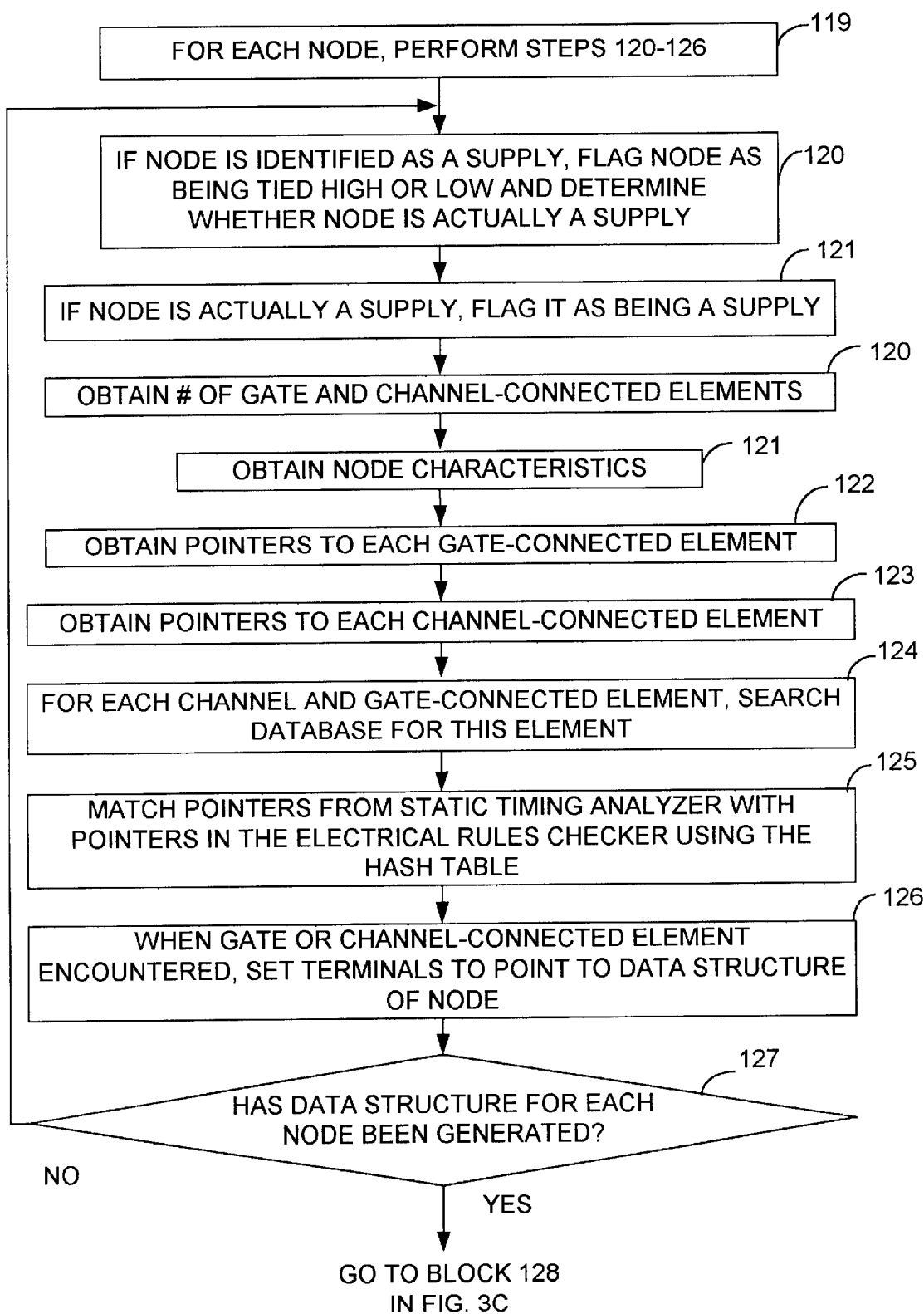

The first step in the process of generating the database is to allocate memory for the nodes and elements of the circuit, as indicated by block 112 in FIG. 3A. The Pathmill program provides information via its API about the number of elements and nodes in the circuit of the electrical rules checker 100 and this information is utilized by the electrical rules checker 100 to perform memory allocation. Certain types of nodes and elements do not require as much information about their characteristics as do other types of nodes and elements. Therefore, the amount of memory allocated may vary for different types of nodes and elements. Rather than merely basing memory allocation on the number of nodes and elements in the circuit, it may be desirable to distinguish between different types of nodes and elements so that memory can be more efficiently allocated.

However, it will be apparent to those skilled in the art that the present invention is not limited with respect to the manner in which memory space is allocated for the nodes and elements. Those skilled in the art will understand the manner in which the memory allocation task, and any optimizations of it, can be performed. Therefore, in the interest of brevity, a detailed discussion of the memory allocation task for the nodes and elements will not be provided herein.

Once memory has been allocated for the nodes and elements, the next step in the process of the present invention is to set up node pointers for special cases of nodes, as indicated by block 114. These special types of nodes will be used repeatedly during the process of generating the database, as discussed below in more detail. Therefore, the pointers for these nodes preferably are set up relatively early in the database generation process. For example, nodes which correspond to ground (GND) and to the supply voltage ($V_{DD}$) are special types of nodes and it is helpful to set up node pointers for these types of nodes. However, those skilled in the art will understand that this step, although it is preferable, is not necessary, but rather, is used to optimize efficiency in the database generation process of the present invention.

For each element, a data structure must be generated which can be utilized by the electrical rules checker 100 in performing the rules checking tasks. Steps 115–117 in FIG. 3A correspond to the steps for creating the element data structures. For each element, a data structure is defined and statistical information relating to the element is added to the data structure of the element, as indicated by block 115. This information includes, for example, the width of the element, the length of the element, the direction of the element, and the element type.

Once the statistical information has been included in the data structure of the element, the pointers for the source, drain and gate of each element, as defined in the space of the static timing analyzer, are included in the data structure of the element, as indicated by block 116. The pointers that were set up in step 114 are utilized in step 116. If either the source, drain or gate of the element is attached to ground or VDD, then the pointers for the source, drain and gate are set to the pointers for ground or VDD obtained in step 114.

A node in a circuit can be represented logically or physically. A logical representation of an element includes only FETs and does not include any resistors. This logical representation is identified in the Pathmill program as a "supernode". The logical representation does not account for parasitic resistance. On the other hand, a physical representation of a node, which is identified in the Pathmill program as a small node, includes FETs, but also includes resistors, which correspond to the parasitic resistance in the node. Therefore, in the physical representation, a small node exists between the resistors representing the parasitic resistance and between any FET and any one of the resistors. Each element has a pointer to a supernode and to a small node for each drain, source and gate. Therefore, there are six pointers for each FET.

All of the small nodes in the physical representation map to the same supernode in the logical representation. In Pathmill, the supernode of the logical representation is mapped to one of the physical small nodes, and vice versa. In block 117, the pointers corresponding to these nodes are added to the data structure of the element.

Once the data structures for the elements have been generated, the data structures for the nodes must be generated. Blocks 118–120 in FIG. 3A and blocks 121–126 in FIG. 3B correspond to the steps in the process of the present invention for generating the data structures of the nodes. In block 118, a determination is made as to whether a node has been identified by the Pathmill program as a supply. The Pathmill program identifies all nodes as supplies if the nodes are either tied high or low. If the node has been identified by the Pathmill program as corresponding to a supply, the node is flagged and the flag will indicate whether the node is tied high or whether it is tied low. A determination is then made as to whether the node is actually a supply, i.e., whether the node actually corresponds to ground or $V_{DD}$. If a determination is made that the node is actually a supply, the node is flagged as corresponding to a supply, as indicated by block 119.

The electrical rules checker 100 then obtains the number of gate-connected elements and the number of channel-connected elements from the static timing analyzer, as indicated by block 120. The electrical rules checker 100 also obtains the characteristics of the nodes from the static timing analyzer 10, as indicated by block 121. These characteristics include, for example, capacitance, node type, rise and fall time, etc. Once the characteristics of the node have been obtained, the electrical rules checker 100 obtains the pointers provided by the static timing analyzer 10 that point to each gate-connected element, as indicated by block 122. The electrical rules checker 100 then obtains the pointers from the static timing analyzer which point to each channel-connected element, as indicated by block 123. Then, for each channel-connected element and for each gate-connected element, the electrical rules checker 100 searches its database to find an element in the space of the electrical rules checker 100 that corresponds to the element under consideration, as indicated by block 124.

The pointers for the elements provided by the static timing analyzer 10 are then matched with the pointers for the corresponding elements in the electrical rules checker 100 using a hash table which converts the pointers in the space of the static timing analyzer 10 into pointers in the space of the electrical rules checker 100, as indicated by block 125. Generally, each of the pointers in the space of the static timing analyzer corresponds to a hash key and when the hash key is plugged into the hash table, the pointer in the space of the electrical rules checker is output from the hash table.

Hash tables and the manner in which they are utilized are well-known in the art. Therefore, a detailed discussion of the manner in which the pointers in the space of the static timing analyzer are converted using the hash table into pointers in the space of the electrical rules checker 100 will not be provided herein since persons skilled in the art will understand the manner in which this can be accomplished.

Once these steps have been performed, the electrical rules checker 100 has at its disposal a list of channel-connected elements and gate-connected elements as well as their pointers in the space of the electrical rules checker 100. In generating the node data structures, when the electrical rules checker 100 encounters a node that is connected to one of these channel-connected or gate-connected elements, the electrical rules checker 100 sets the terminals of the element to point to the data structure of the node under consideration, as indicated by block 126. The process then returns to the step in block 120 and generation of the data structure for the next node begins, as indicated by decisional block 127.

Figure 3C:
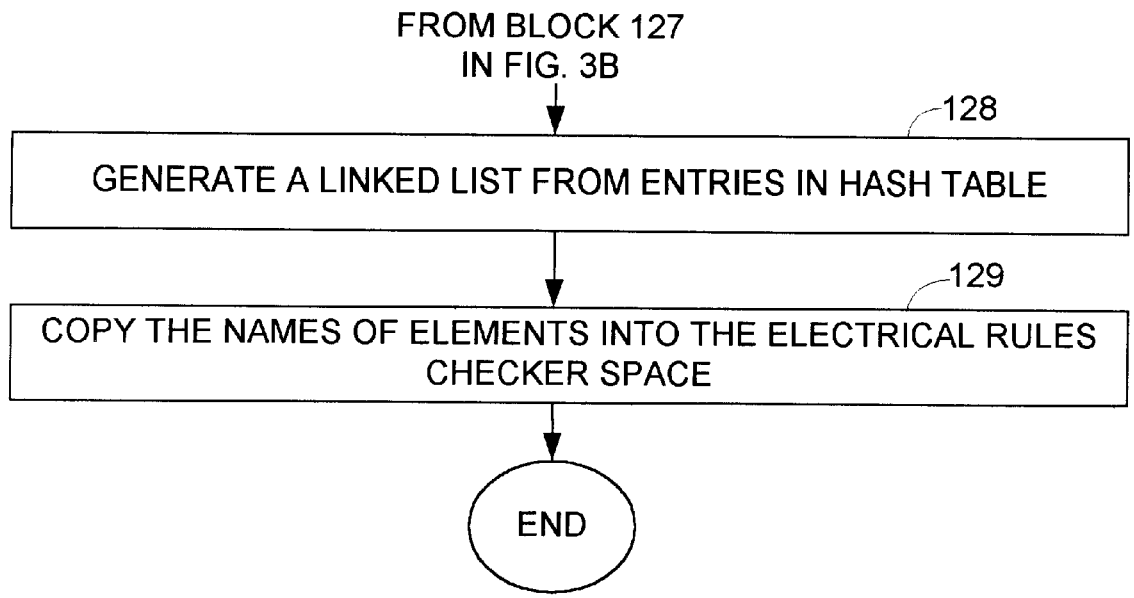

In order to enable the electrical rules checker 100 to maximize efficiency in searching the database of the present invention, once the data structures for all of the nodes have been created, a linked list is generated from the entries in the hash table, as indicated by block 128 in FIG. 3C. Every location in the hash table will not contain a valid entry. Therefore, in order to maximize efficiency in searching the database, a linked list is generated which links the valid entries in the hash table together such that each valid entry in the hash table points to the next valid entry in the hash table, as indicated by block 128. Thus, when the electrical rules checker 100 of the present invention is searching for an element in the database of the present invention, the electrical rules checker 100 simply analyzes the elements contained in the linked list.

It should be noted that the arrangement of the elements in the linked list may or may not have any physical relationship to the arrangement of the elements in the circuit under consideration. Thus, the linked list is merely used to search through the elements stored in the database. Once the linked list has been generated, the names of the elements contained in the linked list are copied into electrical rules checker space, as indicated by block 129. This reduces the number of calls that need to be made to the Pathmill program by the electrical rules checker 100. Once the database of the present invention has been generated, no more calls have to be made to the Pathmill program via the Pathmill. The database of the present invention is comprised as the binary file 106 shown in FIG. 2.

Once the database of the present invention has been generated in the manner described above, the electrical rules checker 100 of the present invention utilizes this database to perform the rules checking tasks. However, it should be noted that the generation of the database is not critical to the present invention, as will be understood by those skilled in the art. Utilization of the database of the present invention enables the rules checker 100 to maximize efficiency in performing its tasks and reduces the number of API calls to the timing analyzer 10.

In accordance with the present invention, the electrical rules checker 100 evaluates a circuit to determine which branch in the network has the largest total effective RC delay. This task is represented by block 103 in FIG. 2. The manner in which the electrical rules checker 100 determines the largest total effective RC delay of a network of the integrated circuit will be discussed below with reference to FIGS. 4–6D.

Figure 4:
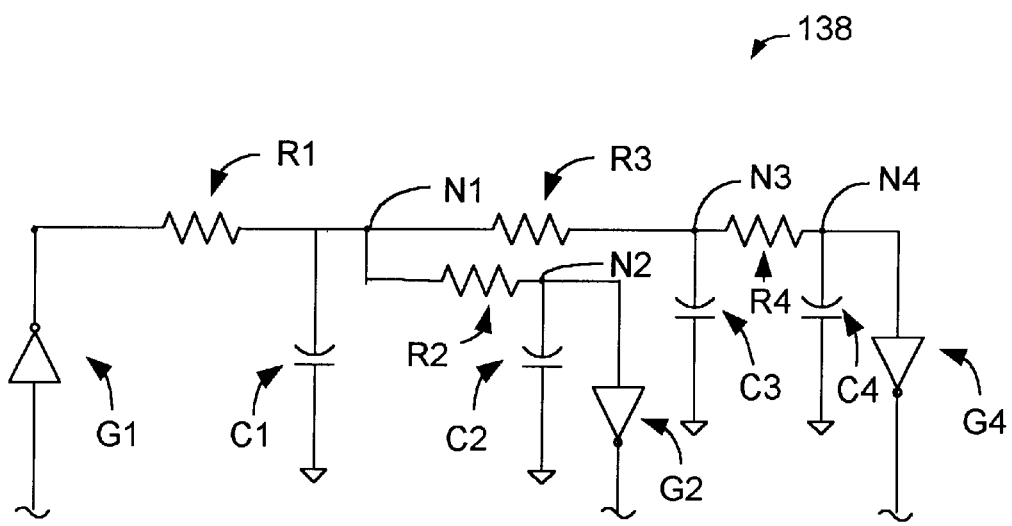
FIG. 4 is a schematic block diagram of an example of a typical network that the electrical rules checker of the present invention shown in FIG. 2 may evaluate to determine the RC delays of the network.

FIG. 4 is a schematic diagram of a network 138 comprised in an integrated circuit. The network 138 is an example of a typical network in an integrated circuit and will be used to discuss the manner in which the electrical rules checker 100 of the present invention determines which of the branches of the network 138 has the largest total effective RC delay. The network 138 shown in FIG. 4 comprises a single driver gate G1 and two receiver gates G2 and G4. Each of the receiver gates G2 and G4 are located on separate branches of the network 138. The network 138 comprises parasitic resistances which result from the conductive paths through the network 138 and which are represented as resistors R1, R2, R3 and R4. The network 138 also contains capacitances which are represented by capacitors C1, C2, C3 and C4. The manner in which the electrical rules checker 100 of the present invention analyzes a network, such as network 138, to determine which branch of the network corresponds to the largest total effective RC delay will now be discussed with reference to FIGS. 5–6D.

Figure 5:
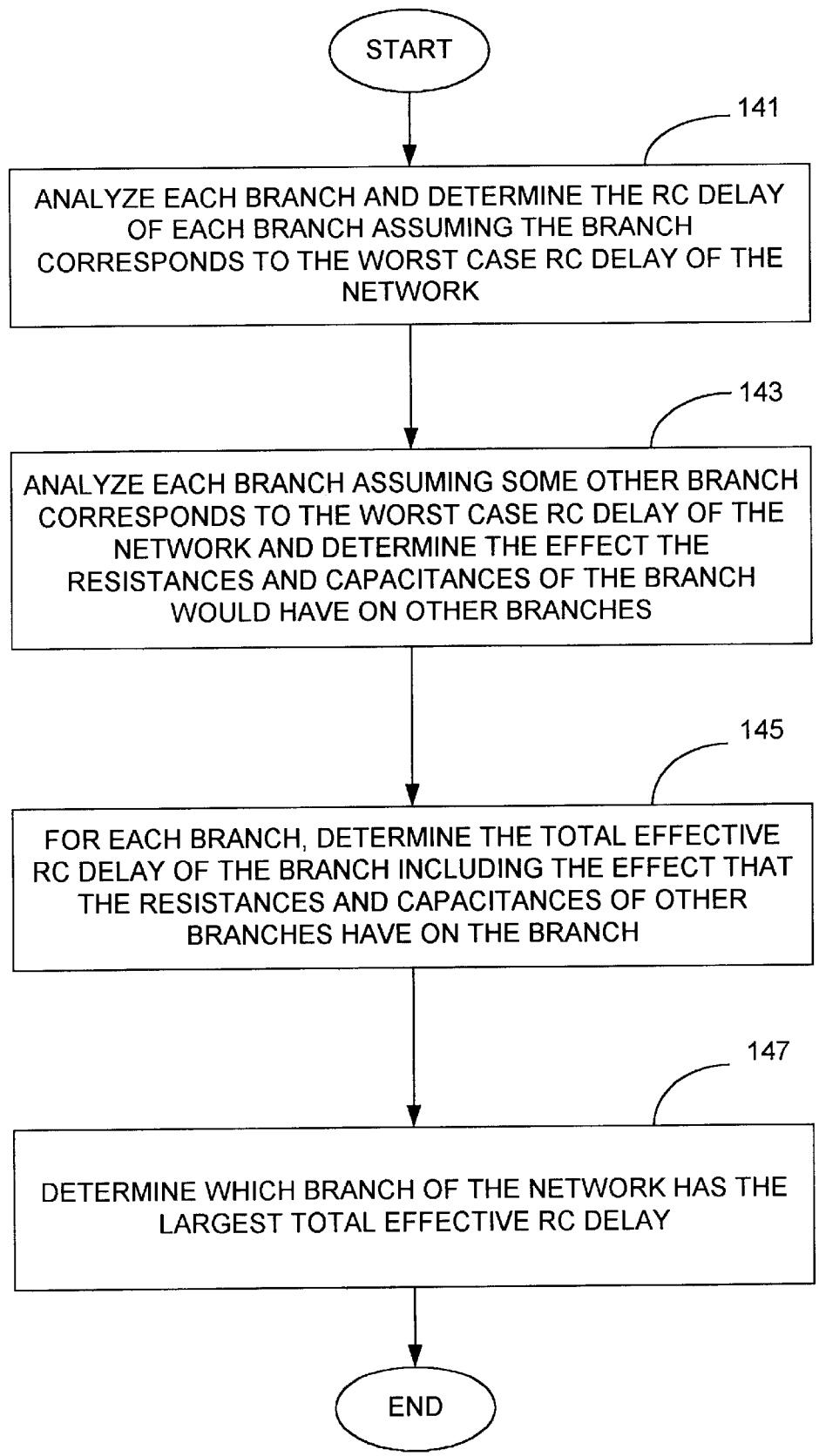
FIG. 5 is a block diagram illustrating the functions performed by the electrical rules checker of the present invention in order to determine which branch of the network has the largest total effective RC delay.

FIG. 5 is a flowchart representing the functions performed by the electrical rules checker 100 in determining which branch of a network of an integrated circuit has the largest total effective RC delay. As represented by block 141, the electrical rules checker 100 analyzes each branch of a network and determines the primary RC delay of each branch assuming that that the branch being analyzed corresponds to the worst case RC delay of the network (i.e., assuming the branch being analyzed has the largest RC delay of all of the branches of the network). The electrical rules checker 100 then analyzes each branch assuming that one of the other branches corresponds to the worst case RC delay of the network and determines the effect that the resistances and capacitances of the branch being analyzed would have on other branches of the network, as indicated by block 143.

Once steps 141 and 143 have been performed, the electrical rules checker 100 determines the total effective RC delay of each branch by combining the effect that the other branches have on the branch being analyzed with the primary RC delay of the branch being analyzed, as indicated by block 145. Once the total effective RC delays of all of the branches have been determined, the electrical rules checker 100 determines which branch of the network has the largest total effective RC delay, as indicated by block 147. This is accomplished by comparing the total effective RC delays of all of the branches together to determine which of the total effective RC delays is the largest.

Once a determination has been made as to which of the branches of the network has the largest total effective RC delay, this information may be utilized to determine other useful characteristics of the integrated circuit, such as, for example, the skew of the processor clock of the integrated circuit.

It should be noted that a number of algorithms may be utilized to perform the functions represented by blocks 141, 143, 145 and 147. Those skilled in the art will understand that the present invention is not limited with respect to the manner in which these functions are performed. It should also be noted that the order in which the functions are performed is not limited to the order illustrated in FIG. 5. For example, although the functions represented by block 143 is illustrated in FIG. 5 as occurring after the functions represented by block 141, the functions represented by block 143 may be performed prior to performing the functions represented by block 141, as will be understood by those skilled in the art.

FIGS. 6A–6D are flowcharts that illustrate the preferred algorithm performed by the electrical rules checker 100 to determine which branch of a network of an integrated circuit corresponds to the largest total effective RC delay. However, as stated above, those skilled in the art will understand that the algorithm performed by the electrical rules checker 100 in making this determination is not limited to the particular algorithm shown in FIGS. 6A–6D. Those skilled in the art will understand, in view of the description provided herein, that a variety of algorithms may be designed that are suitable for making this determination and that all such algorithms are within the scope of the present invention.

An example of the manner in which the algorithm depicted by FIGS. 6A–6D analyzes a network to determine the largest total effective RC delay will now be discussed with reference to the network 138 shown in FIG. 4. As stated above, the network 138 comprises two receiver gates G2 and G4 that are located on separate branches of the network 138. The branch comprising driver gate G4 comprises nodes N1, N3 and N4, resistances R3 and R4 and capacitances C3 and C4. This branch will be referred to hereinafter as branch 0. The second branch of the network 138, which will be referred to hereinafter as branch 1, comprises nodes N1 and N2, receiver gate G2, resistance R2 and capacitance C2.

When the electrical rules checker 100 makes a call to the algorithm depicted in FIGS. 6A–6D, the electrical rules checker 100 sets a variable "CUMULATIVE_r" equal to the resistor connected to the output of driver G1, which is R1, and marks the output of driver G1. Since a plurality of networks may be connected to the output of the gate G1, the algorithm of FIGS. 6A–6D may be performed for a plurality of networks. Therefore, each time the algorithm represented by FIGS. 6A–6D, referred to hereinafter as the CALC_RC routine, a separate CUMULATIVE_r variable will need to be set for each network. When CALC_RC is called, the first node opposite the output of the driver gate is selected as the starting node. In this example, node N1 will be selected as the starting node when CALC_RC is called. In the step represented by block 151, a variable "INDEX" is set equal to 0. The starting node at which the routine begins, N1, is marked. The routine then obtains the first channel-connected element on the starting node, N1, which could be R1, R2 or R3.

Once these steps have been performed, the process proceeds to block 153 where a determination is made as to whether or not the first channel-connected element is a resistor. Since FETs may also be channel-connected to nodes, a determination must be made as to whether or not the channel-connected element is a resistor. Capacitances are treated as properties of nodes and, therefore, are not considered to be channel-connected elements. However, this is merely an implementation detail of the electrical rules checker 100 of the preferred embodiment and is not a limitation of the present invention, as will be understood by those skilled in the art.

Assuming resistor R3 is obtained, the process will proceed to block 155 and the node opposite node N1 on the other side of the resistor R3, will be obtained. A determination will then be made at block 157 as to whether or not node N3 is marked. Since this is the first time the branch has been traversed, node N3 will not yet have been marked. Therefore, the process will proceed to block 159. At block 159, a recursive call is made to the portion of the CALC_RC routine represented by the flow chart of FIG. 6A. Therefore, the portion of the CALC_RC routine represented by the flow chart of FIG. 6A will be performed beginning at block 151.

Prior to performing the functions represented by block 151, the starting node, N1, will be pushed onto the stack (not shown). A variable "CUMULATIVE_r" which maintains a total value of the resistance along the branch, is also pushed onto the stack. The starting node is then set to the opposite node, which is N3. The variable CUMULATIVE_r will then be set equal to the current value of CUMULATIVE_r plus the resistance of the current element, which is R3. Therefore, at node N3 the CUMULATIVE_r variable will contain a value equal to the sum R1+R3.

The routine will then proceed to block 151. The INDEX variable is set equal to 0 and the starting node, N3, is marked. The first channel-connected element on node N3, which could be R3 or R4, will then be obtained. Assuming that resistor R4 is obtained, the process will proceed from block 153 to block 155 and the opposite node, N4, will be obtained. A determination will then be made at block 157 as to whether or not this node has been marked. Since this is the first time in the process that node N4 has been encountered, it will not yet have been marked and the process will proceed to block 159.

Figure 6A:
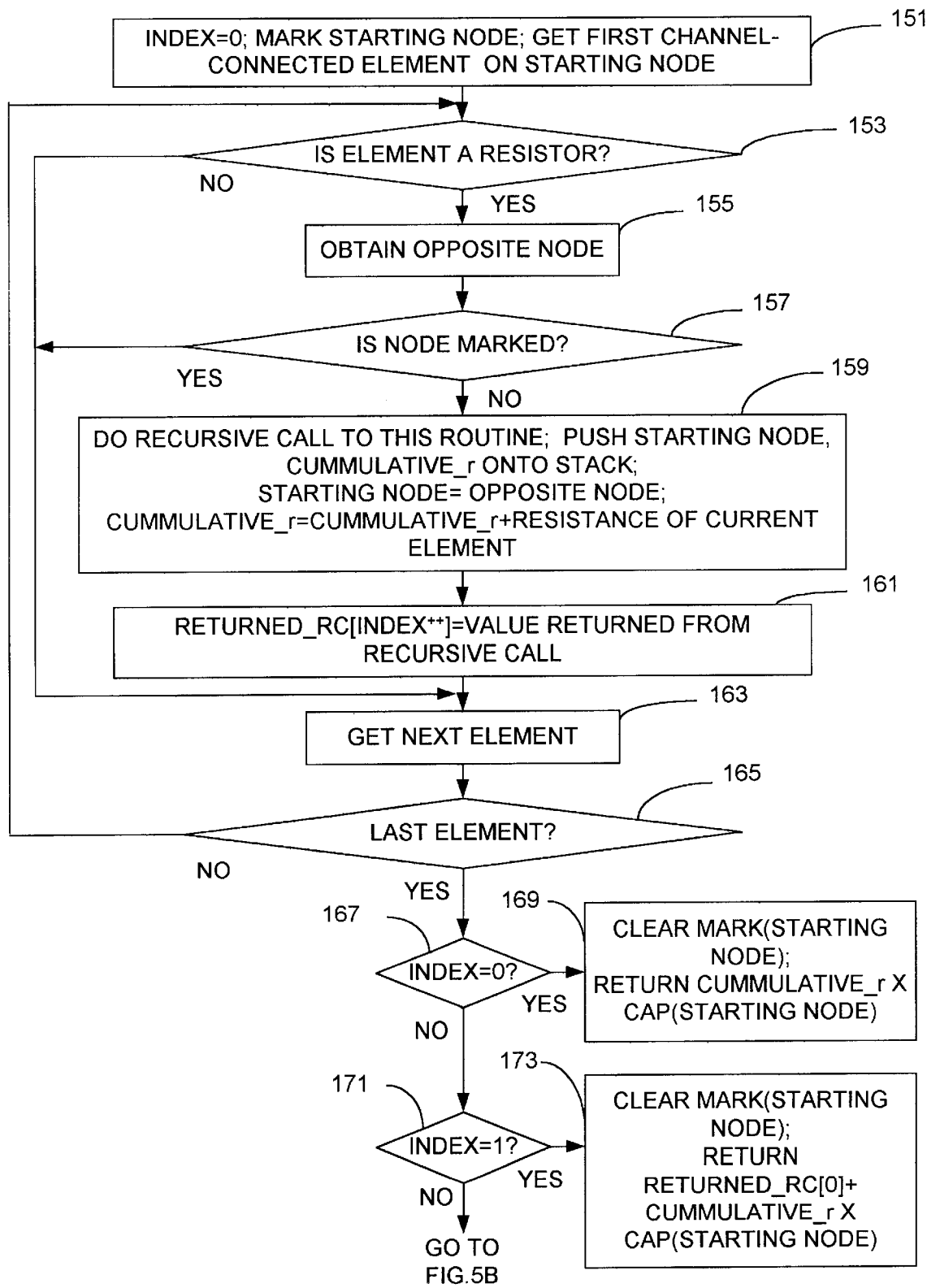

At block 159, a recursive call will once again be made to the portion of the CALC_RC routine represented by FIG. 6A. The starting node, N3, is pushed onto the stack along with the value of CUMULATIVE_r. The starting node is then set to node N4 and the variable CUMULATIVE_r is set equal to the current CUMULATIVE_r plus the resistance of the current element, R4. Therefore, the value of the variable CUMULATIVE_r at this point in the routine is the sum of R1+R3+R4.

The process then proceeds to block 151 where the INDEX variable is set to 0 and the starting node, N4, is marked. The first channel-connected element on node N4, which is resistor R4, is then obtained. A determination is then made at block 153 that the element is a resistor and the process proceeds to block 155. At block 155, the node opposite node N4, which is node N3, is obtained. At block 157, a determination will be made that node N3 has been marked and the process will then proceed to block 163. At block 163, the next channel-connected element on node N4 will be obtained. Since the only channel-connected element on node N4 is resistor R4, which has already been obtained, a determination will be made at block 165 that resistor R4 is the last element on node N4.

The process will then proceed to block 167 where a determination will be made as to whether or not the INDEX variable is equal to 0. Since the INDEX variable for node N4 was not incremented, it is equal to 0, and the process will proceed to block 169. At block 169 the mark on the starting node N4 will be cleared and a value equal to CUMULATIVE_r multiplied by the capacitance of the starting node will be obtained. The CUMULATIVE_r at this point will be equal to the sum R1+R3+R4 and the capacitance of the starting node, N4, will be C4. The product of CUMULATIVE_r×CAP (STARTING NODE) will then be returned to block 161 and stored in an array designated by the variable "RETURNED_RC[INDEX++]". Since the INDEX for node N3 is 0 at this point, the variable RETURNED_RC[INDEX++] will correspond to RETURNED_RC[0], and will designate the current RC value for branch 0 at this point in the routine. The value of the INDEX variable for node N3 is incremented when the process returns to block 161 from the recursive call.

When the process returns from the recursive call for node N4, the process will return to node N3, which was the starting node from which the recursive call for node N4 was made. This node and the CUMULATIVE_r value associated with it are popped off of the stack. The process will then proceed to block 163 where the next element will be obtained. Since resistor R4 has already been obtained, resistor R3 will be obtained. A determination will then be made at block 165 that element R3 is the last element on node N3 since element R4 has already been obtained. The process will then proceed to block 153, then to block 155, and then to block 157. The recursive call will be skipped and the process will then return to block 163. Since resistor R3 was the last element, the process will proceed to block 167.

At block 167, a determination will be made that the INDEX is equal to 1 for node N3 since the INDEX variable has been incremented for node N3. The process will then proceed to block 171. Since the INDEX variable for node N3 is 1, the process will proceed to block 173. At block 173, the mark on the starting node, N3, will be cleared. The product of CUMULATIVE_r×CAP(STARTING NODE) will be obtained. At this point in the routine, the value of CUMULATIVE_r for node N3 is equal to R1+R3 and the capacitance of node N3 is C3. The value of RETURNED_RC[0] that was returned to block 161 from the recursive call of node N4 is then added to the product of CUMULATIVE_r×CAP(STARTING NODE) for node N3. This value will then be returned to block 161 and will be stored in the array RETURNED_RC[INDEX++]. Therefore, at this point in the CALC_RC routine, the value of RETURNED_RC[0] for node N1 will be equal to the sum of these two RC delays along branch 0. The INDEX variable associated with node N1 will then be incremented to 1.

After returning to block 161, the process will return to node N1, since this is the node from which the recursive call for node N3 was made. This node and the CUMULATIVE_r value associated with it are popped off of the stack. The routine will then obtain the next element that is channel-connected to node N1, which is resistor R2. A determination will then be made at block 165 that resistor R2 is the last element since all of the other channel-connected elements on node N1 have already been obtained. The process will then return to block 153 where a determination will be made that the element R2 is a resistor. The routine will then obtain the node on the other side of R2, which is N2. A determination will then be made at block 157 that node N2 has not been marked and the process will proceed to block 159.

At block 159, the starting node, N1, and the CUMULATIVE_r value, which is R1 at this point in the routine, will be pushed onto the stack. The starting node win then be set to the opposite node, which is N2, and the variable CUMULATIVE_r will be set equal to the sum of CUMULATIVE_r plus the resistance of the current element, R2. Therefore, the value of the variable CUMULATIVE_r will be R1 plus When the recursive call is made, the process will proceed to block 151 where the value of the INDEX variable will be set to 0 and the starting node, N2, will be marked. The fist channel-connected element on the starting node, which is R2, will then be obtained. A determination will then be made at block 153 that element R2 is a resistor and the process will proceed to block 155. At block 155, the opposite node, N1, will be obtained. A determination will then be made at block 157 that this node is marked and the process will then proceed to block 163. At block 163, the next element that is channel-connected to node N2 will be obtained. Since resistor R2 is the only element that is channel-connected to node N2, a determination will be made at block 165 that resistor R2 is the last element and the process will proceed to block 167.

At block 167, a determination will be made that the value of the INDEX variable for node N2 is equal to 0 since the INDEX variable for node N2 has not been incremented. Therefore, the process will proceed to block 169. At block 169, the mark on the starting node, N2, will be cleared and the value of the product CUMULATIVE_r×CAP (STARTING NODE) will be returned at block 161. At this point in the routine, the value of CUMULATIVE_r is equal to R1+R2 and the capacitance of the starting node, N2, is C2. The value of this product, (R1+R2)×C2, is returned and stored in the array for node N1 as RETURNED_RC[1]. The value of the INDEX variable for node N1 is also incremented to 2 at block 161.

After the recursive call for node N2 has been made, the process returns to node N1. At block 163, the next element that is channel-connected to node N1 will be obtained. Resistor R1 will then be obtained and the process will proceed to block 153 and then to block 155. At block 155, the opposite node, which is the output of driver G1 will be obtained. Since this node has previously been marked, the recursive call will be skipped and the process will proceed to block 163. Since resistor R1 is the last element on node N1, the process will proceed from block 165 to block 167. A determination will then be made at block 167 that the INDEX variable is not equal to 0 and the process will proceed to block 171. At block 171, a determination will be made that the INDEX is not equal to 1 because the INDEX has been incremented to 2, since two recursive calls were made from node N1. Therefore, the process will proceed to block 181 in FIG. 6B.

Figure 6B:
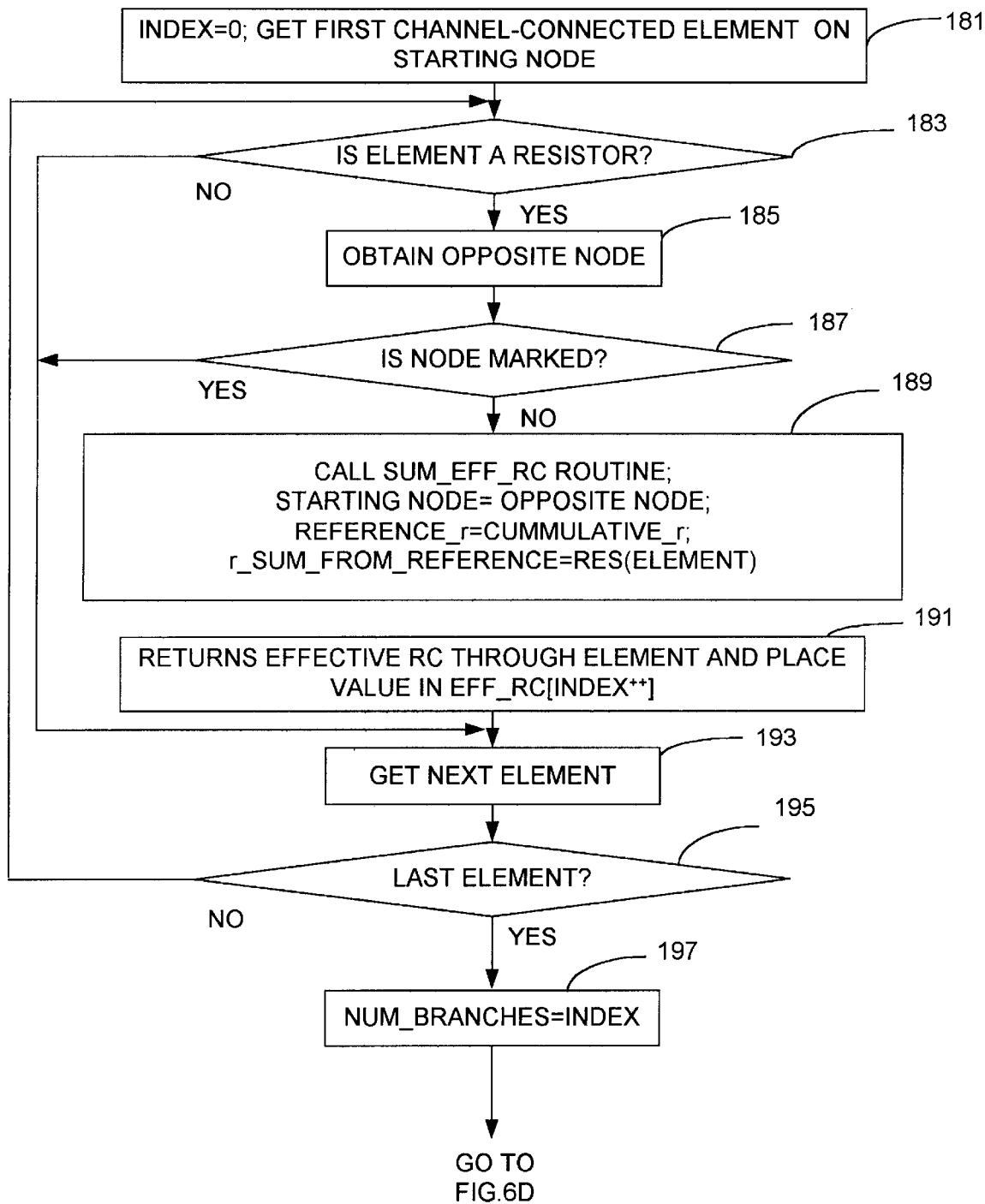

The portion of the CALC_RC routine illustrated by the flow chart of FIG. 6B determines the effects that the resistances and capacitances of each branch have on the other branch or branches. At block 181, the value of the INDEX variable is set to 0 and the first channel-connected element on node N1 is obtained. Assuming that the first channel-connected element obtained in R3, a determination will be made at block 183 that element R3 is a resistor and the process will proceeds to block 185. At block 185, the opposite node, N3, will be obtained. A determination will then be made at block 187 that node N3 has not yet been marked and the process will proceed to block 189.

Figure 6C:
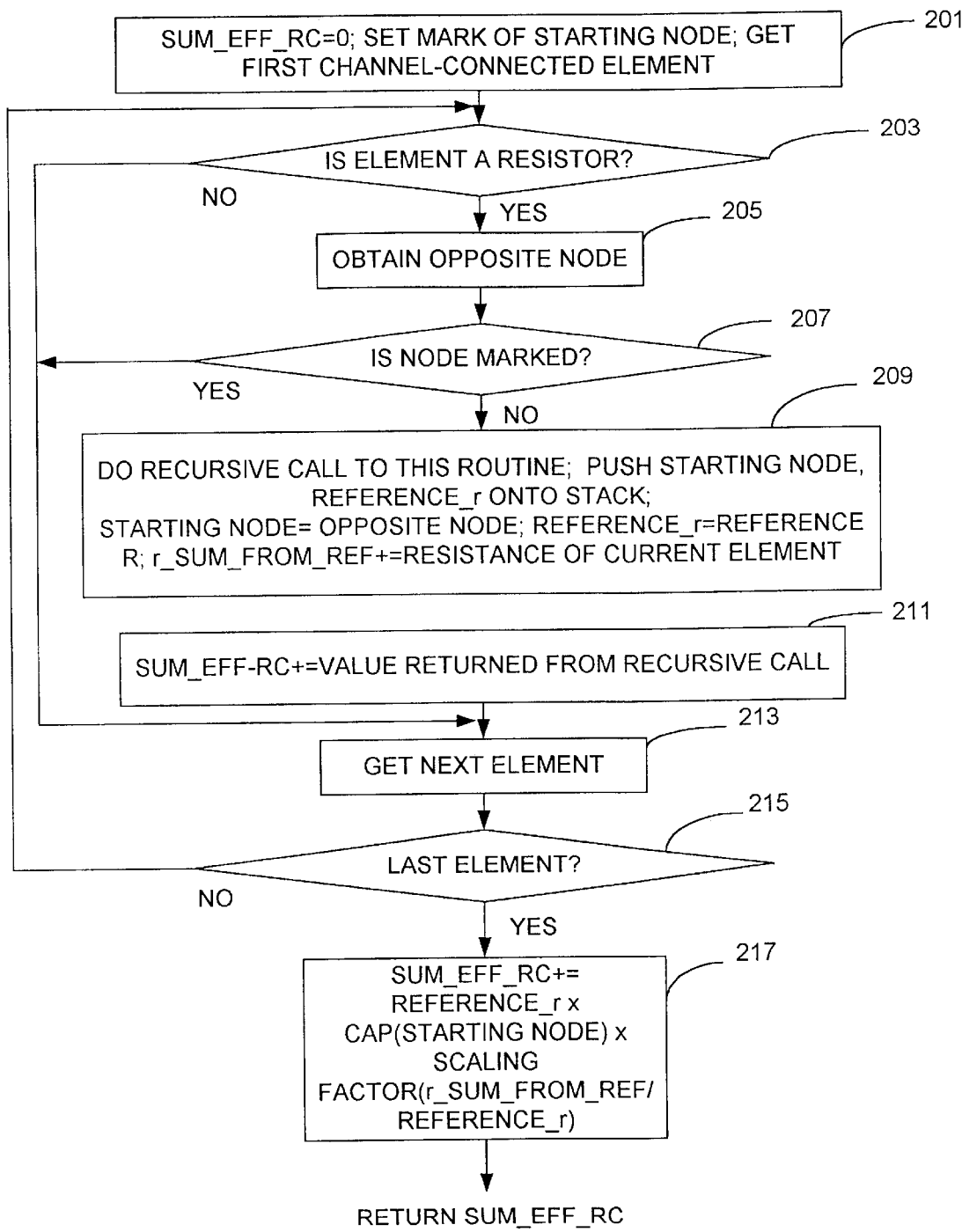

At block 189, a call will be made to a routine hereinafter referred to as the SUM_EFF_RC routine, which is illustrated in FIG. 6C. Therefore, the process proceeds to block 201 in FIG. 6C. However, prior to proceeding to block 201, the starting node will be set to the opposite node, N3, and a variable "REFERENCE_r" will be set equal to the value of CUMULATIVE_r, which at this point in the routine is equal to the value of R1. A variable "r_SUM_FROM_REFERENCE" will be set equal to the resistance of the current element, RES(ELEMENT), which is R3 at this point in the routine. The process will then proceed to block 201.

At block 201, a variable "SUM_EFF_RC" will be set equal to 0 and the starting node, N3, will be marked. The first element that is channel-connected to node N3 will then be obtained. Assuming the resistor R4 is obtained, a determination will be made at block 203 that the element is a resistor and the process will proceed to block 205. At block 205, the opposite node, N4, will be obtained. A determination will then be made at block 207 that this node has been marked and the process will proceed to block 209.

At block 209, a recursive call is made to the routine illustrated by FIG. 6C. Therefore, the process will proceed from block 209 to block 201. However, prior to proceeding to block 201, the starting node, N3, and the CUMULATIVE_r value are pushed onto the stack. The starting node is set equal to the opposite node, which is N4.

The value of REFERENCE_r for node N4 is set equal to the value of REFERENCE_r for node N3, which is equal to R1 since each of the branches are referenced to this resistor at node N1. The resistance of the current element, R4, is then added to the value of the variable r_SUM_FROM_REF to give it a value equal to R3+R4.

When the routine proceeds to block 201 during the recursive call, the variable SUM_EFF_RC is set equal to 0 and the starting node, N4, is marked. The routine then obtains the only element that is channel-connected to node N4, which is resistor R4. The process then proceeds to block 203. At block 203, a determination will be made that element R4 is a resistor and the process will proceed to block 205. At block 205, the opposite node, N3, will be obtained. A determination will then be made at block 207 that node N3 has been marked. The process will then proceed to block 213 and the next element that is channel-connected to node N4 will be obtained.

Since resistor R4 is the only element that is channel-connected to node N4, the process will then proceed to block 217 and the value of the variable SUM_EFF_RC will be set equal to the product of REFERENCE_r times the capacitance of the starting node times a scaling factor associated with the ratio (r_SUM_FROM_REF/REFERENCE_ r). Therefore, the value of the variable SUM_EFF_RC will be set equal to R1×C4×scaling factor ((R3+R4)/R1). The manner in which the scaling factors associated with the ratios of the resistance values are obtained will be discussed below in more detail.

Once the value for the variable SUM_EFF_RC has been obtained, this value will be returned to block 211 where it is added to the previous value of SUM_EFF_RC. The process will then proceed to block 213 where the next element that is channel-connected to the node from which the recursive call was made, N3, will be obtained. Resistor R3 will be obtained since resistor R4 has already been obtained. A determination will then be made at block 215 that resistor R3 is the last element that is channel-connected to node N3. The process will then proceed from block 215 through the loop comprising blocks 203, 205, 207, 213 and back to block 215. The recursive call will be skipped and the process will then proceed from block 215 to block 217.

At block 217, the value of the product of R1×C3×scaling factor (R3/R1) is added to the value of the variable SUM_EFF_RC. The routine then returns the value of SUM_EFF_RC to block 191 in FIG. 6B where the value is placed in the array EFF-RC[INDEX++]. The value of the variable INDEX is 0 since only one call to the SUM_EFF_RC routine has been made. Therefore, the value of the variable SUM_EFF_RC is placed in the array for EFF_RC[0]. The value of the INDEX variable for node N1 is then incremented to 1 and the process proceeds to block 193.

At block 193, the routine obtains the next element that is channel-connected to node N1. Since resistor R2 is not the last element that is channel-connected to node N1, the process will proceed from block 195 to block 183. A determination will then be made at block 183 that the element is a resistor and the process will proceed to block 185 where the opposite node, N2, will be obtained. A determination will then be made at block 187 that the node N2 has not been marked. Therefore, the process will proceed to block 189 where a call will be made to the SUM_EFF_RC routine illustrated in FIG. 6C.

At block 201 in FIG. 6C, the variable SUM_EFF_RC will be set equal to 0 and the starting node, N2, will be marked. The first element that is channel-connected to node N2 will then be obtained. Therefore, resistor R2, which is the only element that is channel-connected to node N2, will be obtained. A determination will then be made at block 203 that the element is a resistor and the process will proceed to block 205. At block 205, the opposite node, N1, will be obtained. A determination will then be made at block 207 that node N1 has been marked and the process will proceed to block 213.

At block 215, the routine will determine that the last element has been obtained and the process will proceed to block 217 where the variable SUM_EFF_RC will be set equal to R1×C2×the scaling factor associated with the ratio R2/R1. This value will then be added to the value of the variable SUM_EFF_RC at block 211. This value will then be returned to block 191 in FIG. 6B where it will be placed in the array EFF-RC[INDEX$^{++}$]. Since the variable INDEX was incremented previously for node N1, the value of the variable SUM_EFF_RC will be placed in the array designated by the variable EFF_RC[1].

At block 193 in FIG. 6B, the routine will obtain the next element on node N1. The resistor R1 will be obtained and the process will proceed through blocks 195, and 183 to block 185, where the output of G1 will be obtained. Since the output of G1 has already been marked, the process will proceed from block 187 to block 193 and the recursive call will be skipped. Since there are no more elements that are channel-connected to node N1, the process will proceed through blocks 193 and 195 to block 197 where the number of branches, which is designated by the variable "NUM_BRANCHES", will be set equal to the value of the INDEX variable. The value of the INDEX variable is 2 since the INDEX variable for node N1 has been incremented twice.

The process will then proceed to block 221 in FIG. 6D. Block 221 in FIG. 6D comprises pseudo code representing the portion of the CALC_RC routine that determines which branch has the largest RC delay taking into account the effects of the resistances and capacitances of all other branches. This portion of the routine combines the primary RC delay for branch 0 calculated by the portion of the CALC_RC routine shown in of FIG. 6A with the effect that the resistances and capacitances of branch 1 has on branch 0, as calculated by the portions of the CALC_RC routine shown in FIGS. 6B and 6C. This portion of the routine also combines the value of the primary RC delay of branch 1 calculated by the routine of FIG. 6A with the effect that the capacitances and resistances of branch 0 has on branch 1, as calculated by the portions of the routine shown in FIGS. 6B and 6C. This portion of the routine then compares these values to determine which, of the branches has the largest total effective RC delay. This is accomplished using nested loops, as described below in detail.

In the portion of the routine shown in FIG. 6D, a variable "MAX_RC" is set equal to 0. For i=0 to NUM_BRANCHES-1, the value of the variable CURRENT_RC is set equal to the value of RETURNED_RC[i] returned to block 161 in FIG. 6A. Therefore, for i=0, the value of the variable CURRENT_RC will be set equal to the value of the variable RETURNED_RC[0]. A second loop within the first loop loops from j=0 to NUM_BRANCHES-1. In this inner-loop, if the value of i is not equal to the value of j, the value of the variable EFF_RCU[0 ] is added to the value of the variable CURRENT_RC, which corresponds to the aforementioned effect returned at block 191 in FIG. 6B. Therefore, the total effective RC delay for branch 0 is equal to RETURNED_RC[0]+EFF RC[1]. Similarly, the total effective RC delay for branch 1 is equal to RETURNED_RC[1]+EFF_RC[0].

Each time the routine exits the inner loop, a determination is made as to whether or not the value of CURRENT_RC is greater than the value of MAX_RC. If so, the value of the variable MAX_RC is set equal to the value of CURRENT_RC. Once the value of i has been incremented to a number equal to the number of branches in the network, the mark on the starting node will be cleared and the largest total effective RC delay will be returned to the electrical rules checker 100. The largest total effective RC delay will correspond to the value of the variable MAX_RC summed with the product of CUMULATIVE_r×CAP(STARTING NODE). This product corresponds to R1×C1 in the network shown in FIG. 4.

The scaling factors discussed above preferably are generated prior to execution of the electrical rules checker algorithm and stored in a lookup table (not shown). The lookup table may be comprised in a memory device (not shown) that is in communication with the computer that executes the electrical rules checker algorithm. In accordance with the present invention, it has been determined that that the resistances and capacitances of a given branch have an effect on the RC delays of the other branches and that the effect is a function of the resistance of the given branch. In essence, the capacitance of a given branch has an effect on the RC delays of the other branches. The effect is related to the resistance of the branch which tends to shield the other branches from the capacitance of the given branch.

The scaling factors utilized in block 217 in FIG. 6C in calculating the value of the SUM_EFF_RC variable are obtained by using the resistive ratios, as shown in the drawings and demonstrated above with reference to the exemplary network of FIG. 4. The manner in which these scaling factors may be obtained will now be described. Generally, the values of the resistances of a network, such as that shown in FIG. 4, are varied and a simulation routine, such as the well known Spice routine, is executed. The simulation routine generates outputs that can be analyzed to determine the effect that the values of the resistance ratios have on the RC delays of one or more other branches. These determinations can be utilized to generate scaling factors, which are then utilized in the manner indicated in block 217 of FIG. 6C. Those skilled in the art will understand the manner in which the data from the simulations can be utilized to generate the scaling factors.

As stated above, the scaling factors preferably are stored in a lookup table. The resistive ratios correspond to addresses in the lookup table. In accordance with the preferred embodiment of the present invention, the scaling factors are linearly interpolated from the resistance ratios, although various curve fitting functions may also be used for this purpose, as will be understood by those skilled in the art.

For example, in an X-Y plane, each resistance ratio corresponds to a value on the x-axis and each scaling factor corresponds to a value on the y-axis. Together, the X and Y values form a line in the X-Y plane. For each X value, i.e., for each resistance ratio, the corresponding Y value on the line corresponds to the scaling factor. The electrical rules checker 100 simply utilizes the resistance ratio to obtain the corresponding scaling factor from memory. One set of suitable scaling factors corresponds to a line having coordinates X1=0, Y1=1.0, X2=5.0, Y2=0.61. This is a negatively sloping line. Therefore, the larger the resistance ratio is, the smaller the scaling factor will be. The electrical rules checker 100 simply utilizes the resistance ratio as an address to read the corresponding scaling factor out of the lookup table. Alternatively, the electrical rules checker can utilize the resistance ratio to calculate the corresponding scaling factor on the fly by simply determining the Y value on the line that corresponds to the resistance ratio.

It should be noted that the foregoing description is not intended to be exhaustive or to limit the invention to the precise forms disclosed. Those skilled in the art will understand that modifications or variations are possible in light of the above teachings, which are within the scope of the present invention. In this regard, the embodiment discussed above was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention.

What is claimed is:

1. An apparatus for determining a total effective RC delay of each branch of a network and for determining which branch has the largest total effective RC delay, the network being comprised in an integrated circuit, each branch having a primary RC delay associated therewith, the primary RC delay of each branch being attributable to one or more resistances and one or more capacitances comprised by the branch, the apparatus comprising:

a computer programmed to execute a rules checker algorithm, wherein when the rules checker algorithm is executed by the computer, the rules checker algorithm analyzes each branch to determine a total effective RC delay of each branch, wherein the total effective RC delay of a particular branch includes the primary RC delay attributable to said one or more resistances and said one or more capacitances of the particular branch and an effect that said one or more resistances and said one or more capacitances of any other branches have on the particular branch, the rules checker algorithm determining which branch has the largest total effective RC delay.

2. The apparatus of claim 1, wherein the rules checker algorithm determines which branch of the network has the largest total effective RC delay by:

analyzing each branch and determining the primary RC delay associated with each branch;

analyzing each branch and determining the effect that said one or more resistances and said one or more capacitances of the branch being analyzed would have on other branches;

determining the total effective RC delay of each branch by combining the primary RC delay of each branch with the effect that said one or more resistances and said one or more capacitances of any other branch have on the branch associated with the primary RC delay; and comparing the total effective RC delays of the branches to determine which of the branches has the largest total effective RC delay.

3. The apparatus of claim 2, wherein the network comprises a driver gate and first and second receiver gates, the first and second receiver gates each having an input that is electrically coupled by first and second branches, respectively, to an output of the driver gate, and wherein the rules checker algorithm traverses the branches and calculates the primary RC delay associated the branches.

4. The apparatus of claim 3, wherein the rules checker algorithm traverses the branches and calculates the effects that the resistances and capacitances of each branch has on the other branch.

5. The apparatus of claim 4, wherein the rules checker algorithm calculates the total effective RC delay of the first branch by combining the effect that said one or more resistances and capacitances of the second branch has on the first branch with the primary RC delay of the first branch, wherein the rules checker algorithm calculates the total effective RC delay of the second branch by combining an effect that said one or more resistances and capacitances of the second branch has on the first branch with the primary RC delay of the first branch.

6. The apparatus of claim 5, wherein the rules checker algorithm utilizes said one or more resistances of the first branch to obtain a first scaling factor, the rules checker algorithm processing said one or more capacitances of the first branch in accordance with the first scaling factor to obtain the effect that said one or more resistances and capacitances of the first branch will have on the second branch, and wherein the rules checker algorithm utilizes said one or more resistances of the second branch to obtain a second scaling factor, the rules checker algorithm processing said one or more capacitances of the second branch in accordance with the second scaling factor to obtain the effect that said one or more resistances of the second branch will have on the first branch.

7. The apparatus of claim 6, wherein the first and second scaling factors are stored in first and second address locations, respectively, in a lookup table, wherein the rules checker algorithm reads the first and second scaling factors out of said first and second addresses in the lookup table and processes said one or more capacitances of the first and second branches, respectively, in accordance with the scaling factors.

8. A method for determining a total effective RC delay associated with each branch of a network and for determining which branch has the largest total effective RC delay, the network being comprised in an integrated circuit, each branch having a primary RC delay associated therewith, the primary RC delay of a branch being associated with one or more resistances and one or more capacitances comprised by the branch, the method comprising the steps of:

analyzing each branch to determine a total effective RC delay of each branch, wherein the total effective RC delay of a particular branch includes the primary RC delay attributable to said one or more resistances and said one or more capacitances of the particular branch and an effect that said one or more resistances and capacitances of any other branches of the network have on the particular branch; and determining which of the total effective RC delays is the largest.

9. The method of claim 8, wherein the analyzing step further comprises the steps of:

analyzing each branch and determining the primary RC delay associated with each branch;

analyzing each branch and determining the effect that said one or more resistances and capacitances of the branch being analyzed would have on other branches; and analyzing each branch and determining the total effective RC delay of each branch by combining the primary RC delay of the branch being analyzed with the effect that said one or more resistances and capacitances of any other branch has on the branch being analyzed.

10. The method of claim 9, wherein the step of determining which branch has the largest total effective RC delay comprises the step of:

comparing the total effective RC delays of the branches to determine which of the branches has the largest total effective RC delay.

11. The method of claim 10, wherein the network comprises a driver gate and first and second receiver gates, each of the receiver gates having an input that is electrically coupled by first and second branches, respectively, to an output of the driver gate, and wherein, during the step of analyzing the branches to determine the primary RC delays, the first and second branches are traversed to obtain the values of the resistances and capacitances that are used to calculate the primary RC delays associated with the branches and to determine the effects that the resistances and capacitances of the branches have on other branches.

12. The method of claim 11, wherein the total effective RC delay of the first branch is determined by combining an effect that said one or more resistances and capacitances of the second branch has on the first branch with the primary RC delay of the first branch, and wherein the total effective RC delay of the second branch is determined by combining the effect that said one or more resistances and capacitances of the first branch has on the second branch with the primary RC delay of the second branch.

13. The method of claim 12, wherein the effect that the first branch has on the second branch is determined by utilizing said one or more resistances of the first branch to obtain a first scaling factor and by processing said one or more capacitances of the first branch in accordance with the first scaling factor to obtain the effect that the first branch will have on the second branch, and wherein the effect that the second branch has on the first branch is determined by utilizing said one or more resistances of the second branch to obtain a second scaling factor and by processing said one or more capacitances of the second branch in accordance with the second scaling factor to obtain the effect that the second branch will have on the first branch.

14. The method of claim 13, wherein said one or more resistances of the first and second branches are utilized to generate first and second addresses, respectively, of locations in a lookup table, the first scaling factor being stored in the first address location in the lookup table, the second scaling factor being stored in the second address location in the lookup table, wherein the first and second addresses are utilized to read the first and second scaling factors out of said first and second address locations in the lookup table.

15. A computer-readable medium having a computer program for determining a total effective RC delay associated with each branch of a network and for determining which branch has the largest total effective RC delay, the network being comprised in an integrated circuit, each branch having a primary RC delay associated therewith, the primary RC delay of a branch being associated with one or more resistances and one or more capacitances comprised by the branch, the computer program: being embodied on a computer-readable medium, the program comprising:

a first code segment, the first code segment analyzing each branch to determine a total effective RC delay of each branch, wherein the total effective RC delay of a particular branch includes the primary RC delay attributable to said one or more resistances and said one or more capacitances of the particular branch and an effect that said one or more resistances and capacitances of any other branches of the network have on the particular branch; and a second code segment, the second code segment determining which of the total effective RC delays is the largest.

16. The computer-readable medium of claim 15, wherein the first code segment comprises:

a third code segment, the third code segment analyzing each branch and determining the primary RC delay associated with each branch;

a fourth code segment, the fourth code segment analyzing each branch and determining the effect that said one or more resistances and capacitances of the branch being analyzed would have on other branches; and a fifth code segment, the fifth code segment analyzing each branch and determining the total effective RC delay of each branch by combining the primary RC delay of the branch being analyzed with the effect that said one or more resistances and capacitances of any other branch has on the branch being analyzed.

17. The computer-readable medium of claim, 16, wherein the second code segment compares the total effective RC delays of the branches to determine which: of the branches has the largest total effective RC delay.

18. The computer-readable medium of claim 17, wherein the network comprises a driver gate and first and second receiver gates, the first and second receiver gates having an input that is electrically coupled by first and second branches, respectively, to an output of the driver gate, and wherein the third code segment determines the primary RC delays of the first and second branches by traversing the branches to obtain the values of the resistances and capacitances and by using the values to calculate the primary RC delays associated with the branches.

19. The computer-readable medium of claim 18, wherein the fifth code segment determines the total effective RC delay of the first branch by combining the effect that said one or more resistances and capacitances of the second branch has on the first branch with the primary RC delay of the first branch, and wherein the fourth code segment determines the total effective RC delay of the second branch by combining the effect that said one or more resistances and capacitances of the first branch has on the second branch with the primary RC delay of the second branch.

20. The computer-readable medium of claim 19, and wherein the fourth code segment determines the effect that the first branch has on the second branch by utilizing said one or more resistances of the first branch to obtain a first scaling factor and by processing said one or more capacitances of the first branch in accordance with the first scaling factor to obtain the effect that the first branch will have on the second branch, and wherein the fourth code segment determines the effect that the second branch has on the first branch by utilizing said one or more resistances of the second branch to obtain a second scaling factor and by processing said one or more capacitances of the second branch in accordance with the second scaling factor to obtain the effect that the second branch will have on the first branch.

* * * * *